United States Patent
Dressler et al.

(10) Patent No.: US 9,082,965 B2
(45) Date of Patent: Jul. 14, 2015

(54) MEMORY DEVICE AND CBRAM MEMORY WITH IMPROVED RELIABILITY

(75) Inventors: Cyril Dressler, Tullins (FR); Veronique Sousa, Grenoble (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 13/055,146

(22) PCT Filed: Jul. 27, 2009

(86) PCT No.: PCT/EP2009/059664
§ 371 (c)(1),
(2), (4) Date: Jan. 21, 2011

(87) PCT Pub. No.: WO2010/012683
PCT Pub. Date: Feb. 4, 2010

(65) Prior Publication Data
US 2011/0121254 A1 May 26, 2011

(30) Foreign Application Priority Data
Jul. 29, 2008 (FR) ...................................... 08 55219

(51) Int. Cl.
*H01L 45/00* (2006.01)
*G11C 13/00* (2006.01)

(52) U.S. Cl.
CPC ........ *H01L 45/1233* (2013.01); *G11C 13/0011* (2013.01); *H01L 45/085* (2013.01);
(Continued)

(58) Field of Classification Search
CPC ............................ H01L 27/1052; H01L 43/08
USPC ........... 257/2–5, E45.002, E47.001, E21.001, 257/E21.004, E21.068, E21.158, E21.495, 257/E21.645, E21.662, E27.004, E27.005, 257/E27.081, E29.17, E43.004, E45.001, 257/E45.003, 295, 296, 421, 422, 423, 424, 257/425, 426, 427, 528, 529, 536, 55, 63; 438/102, 104, 382, 622, 652, 900
See application file for complete search history.

(56) References Cited

U.S. PATENT DOCUMENTS 5,761,115 A 6/1998 Kozicki et al.
6,114,719 A * 9/2000 Dill et al. ...................... 257/295
(Continued)

FOREIGN PATENT DOCUMENTS

EP 1 630 880 A2 3/2006
EP 1 630 880 A3 3/2006
(Continued)

OTHER PUBLICATIONS

Bengt Edholm et al., "Silicon-on-Diamond MOS-Transistors with Thermally Grown Gate Oxide", Proceedings 1997 IEEE International SOI Conference, Oct. 1997, 2 pages.
(Continued)

*Primary Examiner* — Stephen W Smoot
*Assistant Examiner* — Edward Chin
(74) *Attorney, Agent, or Firm* — Oblon, McClelland, Maier & Neustadt, L.L.P.

(57) ABSTRACT

A memory device including: one inert electrode including an electrically conductive material, a part of at least one material of resistivity higher than that of the material of the inert electrode, positioned around the inert electrode, a solid electrolyte positioned on at least one part of the inert electrode and of the part of electrically insulating material, and including metal ions originating from an ionizable metal part positioned on the solid electrolyte. The ratio between the coefficient of electrical resistivity of the material of resistivity higher than that of the material of the inert electrode and the coefficient of electrical resistivity of the material of the inert electrode is equal to or higher than approximately 100, and the coefficient of thermal conductivity of the electrically insulating material is equal to or higher than approximately 10 W·m$^{-1}$·K$^{-1}$.

17 Claims, 4 Drawing Sheets

(52) U.S. Cl.
CPC .......... *H01L45/1266* (2013.01); *H01L 45/142*
(2013.01); *H01L 45/143* (2013.01); *H01L*
*45/144* (2013.01); *H01L 45/1658* (2013.01);
*H01L 45/1675* (2013.01)

(56) References Cited

U.S. PATENT DOCUMENTS

| | | | |
|---|---|---|---|
| 7,035,062 B1* | 4/2006 | Mao et al. | 360/324.2 |
| 7,518,212 B2* | 4/2009 | Moore et al. | 257/529 |
| 7,704,789 B2* | 4/2010 | Sun et al. | 438/104 |
| 7,737,428 B2* | 6/2010 | Symanczyk et al. | 257/3 |
| 8,022,547 B2* | 9/2011 | Vaithyanathan et al. | 257/758 |
| 8,048,713 B2* | 11/2011 | Sousa et al. | 438/102 |
| 8,134,139 B2* | 3/2012 | Lin et al. | 257/4 |
| 2005/0243630 A1* | 11/2005 | Hsu et al. | 365/222 |
| 2006/0060832 A1 | 3/2006 | Symanczyk et al. | |
| 2007/0148882 A1 | 6/2007 | Dressler et al. | |
| 2008/0078983 A1* | 4/2008 | Raberg | 257/4 |
| 2008/0149909 A1* | 6/2008 | Philipp et al. | 257/3 |
| 2008/0164453 A1* | 7/2008 | Breitwisch et al. | 257/3 |
| 2008/0246014 A1* | 10/2008 | Lung | 257/4 |
| 2008/0273380 A1* | 11/2008 | Diao et al. | 365/171 |
| 2008/0307108 A1 | 12/2008 | Yan et al. | |
| 2009/0045387 A1* | 2/2009 | Ufert | 257/4 |
| 2009/0098681 A1 | 4/2009 | Sousa et al. | |
| 2009/0121208 A1* | 5/2009 | Nagashima et al. | 257/2 |
| 2009/0190388 A1* | 7/2009 | Bruchhaus et al. | 365/148 |
| 2009/0213643 A1* | 8/2009 | Angerbauer et al. | 365/163 |
| 2009/0231911 A1* | 9/2009 | Liu et al. | 365/163 |
| 2009/0268505 A1* | 10/2009 | Beer | 365/148 |
| 2009/0301894 A1* | 12/2009 | Ehlers et al. | 205/170 |
| 2009/0309087 A1* | 12/2009 | Lung | 257/2 |
| 2009/0321803 A1* | 12/2009 | Kim et al. | 257/296 |
| 2010/0097735 A1* | 4/2010 | Nodin | 361/56 |
| 2010/0291748 A1 | 11/2010 | Dressler et al. | |
| 2012/0039113 A1* | 2/2012 | Wang et al. | 365/148 |
| 2012/0287706 A1* | 11/2012 | Lung | 365/163 |

FOREIGN PATENT DOCUMENTS

| | | |
|---|---|---|
| EP | 1 801 897 A1 | 6/2007 |
| WO | WO 2007/093126 A1 | 8/2007 |

OTHER PUBLICATIONS

A.V. Kolobov, et al., "Photodoping of Amorphous Chalcogenides by Metals", Advances in Physics, vol. 40, No. 5, 1991, pp. 625-684.

J. E. Graebner, et al., "The Thermal Conductivity of Chemical-Vapor-Deposited Diamond films on Silicon", American Institute of Physics, J. Appl. Phys. 71 (7), Apr. 1, 1992, pp. 3143-3146.

Madhusudan Iyengar, et al., "Analytical Modeling for Prediction of Hot Spot Chip Junction Temperature for Electronics Cooling Applications", IEEE, 2006, pp. 87-95.

J. P. Mazellier, et al., "Introduction of Diamond into Advanced FDSOI CMOS", $4^{th}$ EUROSOI Workshop, 2008, 2 pages.

Paul W. May, "Diamond Thin Films: a $21^{st}$-Century Material", The Royal Society, Phil. Trans. R. Soc. Lond. A. (2000), 358, pp. 473-495.

Preliminary Search Report Issued Mar. 24, 2009 in French Patent Application No. 709849 (with English Translation of Category of Cited Documents).

* cited by examiner

MEMORY DEVICE AND CBRAM MEMORY WITH IMPROVED RELIABILITY

TECHNICAL FIELD

The invention concerns the field of rewritable memories, and more specifically that of non-volatile memories, such as CBRAM-type memories using a solid electrolyte.

STATE OF THE PRIOR ART

Depending on the applications and the desired performance specifications, different types of memories are used. Memories of the SRAM, or static RAM, type, have ultra-rapid write times, required for example for computations by a microprocessor. The major disadvantage of these memories is that they are volatile and that the relatively large size of the memory point does not enable a large storage capacity to be obtained in a reasonable volume.

Memories of the DRAM, or dynamic RAM, type store electrical charges in capacitors, providing a large storage capacity. However, these memories have higher write times (several tens of nanoseconds) than those of SRAM-type memories, and are also volatile, the information retention time being of around some tens of milliseconds.

Finally, for applications which require storage of information even when the power is cut, non-volatile memories of the EEPROM or FLASH type, which store charges on floating grids of field effect transistors, are used. However, these memories have disadvantages:
- long write times (a few microseconds), due to the time required for the electrons to move from the channel to the floating transistor grid through the tunnel effect,
- limited density since the reduction of the size of the transistors leads to a reduction of the read signal, i.e. a reduced difference between the two states of the memory point, and a reduction of the information retention time,
- limited number of write cycles (equal to approximately $10^6$), since the information retention capacity declines with the write cycles due to the creation of faults in the oxide of the grid of transistors, allowing the electrons to escape from the floating grid.

Other types of rewritable non-volatile memories exist, based on active materials such as ferroelectric materials (FE-RAM memories), magnetic materials (MRAM memories), phase-change materials (PCRAM memories), and also ion-conduction materials (CBRAM memories).

FIG. 1 represents a schematic diagram of a memory device 10 of the CBRAM type. This memory device 10 includes a solid electrolyte 14 comprising doped chalcogenide, such as GeSe, positioned between a lower nickel electrode 12 forming an inert cathode, and a ionisable metal part 16 comprising silver, i.e. a metal part which can easily form metal ions (in this case, $Ag^{2+}$ silver ions), and forming an anode. Metal ions originating from the ionisable metal part 16 were diffused in the solid electrolyte 14 when this part 16 was deposited on the solid electrolyte 14. An upper electrode 18 is positioned on the ionisable metal part 16. These elements are electrically insulated by lateral dielectric parts 20 comprising $SiO_2$ or SiN, positioned around these elements.

The memory device represented in FIG. 1 forms a memory point, i.e. a unit memory cell, of a memory including a large number of these memory devices. FIG. 2 represents a matrix for addressing a CBRAM-type memory. This matrix includes a large number of addressing transistors, enabling each memory device of this CBRAM memory to be controlled. In FIG. 2, four addressing transistors 10.1 to 10.4, intended to control four memory devices, are represented. These four transistors are electrically linked together by bit lines 22 and word lines 24, enabling each of the memory devices to be addressed independently.

The memory state of a CBRAM memory device results from the difference of electrical resistivity between two states: ON and OFF. At the OFF state the metal ions (in this case $Ag^+$ ions) originating from the ionisable metal part 16 are dispersed throughout the solid electrolyte 14. Thus, no electrical contact is established between the anode and the cathode, i.e. between the ionisable metal part 16 and the lower electrode 12. The solid electrolyte 14 forms an electrically insulating area of high resistivity between the anode 16 and the cathode 12. A write operation in the memory device 10 occurs by applying a potential difference of several hundred microvolts between the anode 16 and the cathode 12 in the form of a pulse of several tens of nanoseconds. The $Ag^+$ metal ions initially dispersed in the solid electrolyte 14 then migrate to the cathode 12 to form a metal deposit. This metal deposit takes the form of metal nanowires or nano-threads, called "dendrites", gradually growing within the electrolytic medium under the effect of the applied voltage, and which ultimately establish electrical conduction bridges between the anode 16 and the cathode 12: this is the ON state. The solid electrolyte 14 then forms an electrically conductive area due to the metal nanowires formed between the anode 16 and the cathode 12.

A delete operation is accomplished by applying a difference of potential of the same current and same duration, but having the opposite sign, between electrodes 12 and 18, where the previously formed metal deposit (the nanowires) is "dissolved" in ionic form in the solid electrolyte 14, enabling the memory device 10 to return to the OFF state.

One advantage of CBRAM memories lies in the fact that the values of the write voltages required, which are less than 1 Volt, are low compared with those of the other types of non-volatile memory (EEPROM, MRAM, PCRAM).

To obtain a reliable CBRAM-type memory, it is necessary to achieve a uniform distribution of the ionisable metal forming the anodes on the solid electrolytes of the various memory devices. This uniform distribution is very difficult to obtain since the $Ag^+$ metal ions are very mobile. An agglomeration of metal particles originating from the anode is generally observed in the area of the lower electrode, which may lead to deformations of the upper layers, and short-circuits between the electrodes, particularly if the quantity of deposited silver is substantial. A CBRAM-type memory therefore generally has low reliability due to a certain number of defective memory points.

ACCOUNT OF THE INVENTION

One aim of the present invention is to propose a memory device, for example intended to form a memory point of a CBRAM-type memory, with improved reliability compared to the memory devices of the prior art.

To accomplish this, the present invention proposes a memory device including at least:
- one electrode comprising an electrically conductive material,
- a part of at least one electrically insulating material, or of resistivity higher than that of the material of the electrode, positioned around and/or beside the electrode,
- a solid electrolyte stacked on at least one part of the electrode and of the part of electrically insulating material, and including metal ions originating from an ionisable metal part positioned against, or opposite, the solid electrolyte, where the ratio between the coefficient of electrical resistivity of the electrically insulating material, or of the material of higher resistivity than that of the material of the electrode, and the coefficient of electrical resistivity of the material of the electrode is equal to or higher than approximately 100, and where the coefficient of thermal conductivity of the electrically insulating material is equal to or higher than approximately 10 W·m$^{-1}$·K$^{-1}$.

The present invention also concerns a memory device including at least:

one inert electrode, able to form an inert cathode, comprising an electrically conductive material, a part of at least one material of resistivity higher than that of the material of the inert electrode, positioned around the inert electrode, a solid electrolyte positioned on at least one part of the inert electrode and of the part of electrically insulating material, and including metal ions originating from an ionisable metal part, able to form an active electrode, for example used as an anode, positioned on the solid electrolyte, where the ratio between the coefficient of electrical resistivity of the material of resistivity higher than that of the material of the inert electrode and the coefficient of electrical resistivity of the material of the inert electrode is equal to or higher than approximately 100, and the coefficient of thermal conductivity of the electrically insulating material is equal to or higher than approximately 10 W·m$^{-1}$·K$^{-1}$.

When a CBRAM memory device is produced the ionisable metal is deposited on a layer, for example of chalcogenide, intended to form the solid electrolyte. However, thermal gradients tend to appear in the layer of chalcogenide since this layer receives a certain quantity of energy which is dissipated in the form of heat, and causes a rise in temperature which differs according to the thermal conductivity of the areas on which the layer of chalcogenide is located. Since chalcogenide materials have very high thermoelectric coefficients, for example equal to approximately 1 mV/K, these thermal gradients can cause differences of potential in the layer of chalcogenide because the coldest areas, such as the lower electrode, i.e. the inert electrode, of the device, are charged negatively and thus attract the metal ions originating from the ionisable metal part.

By choosing, around and/or beside the lower electrode, i.e. the inert electrode, and under the solid electrolyte, an electrically insulating material the thermal conductivity coefficient of which is equal to or higher than approximately 10 W·m$^{-1}$·K$^{-1}$, the thermal conductivity of the electrically insulating support on which the solid electrolyte is deposited is substantially improved, enabling the thermal gradients to be reduced or eliminated, and therefore reducing or eliminating the differences of potential previously appearing in the layer intended to form the solid electrolyte when the ionisable metal is deposited.

This improved thermal conductivity, compared to the electrical insulators used in the memory devices of the prior art ($SiO_2$ has a thermal conductivity equal to approximately 1.5 W·m$^{-1}$·K$^{-1}$), allows the agglomeration of metal ions in the solid electrolyte in the area of the lower electrode forming the inert electrode to be prevented, thus reducing the topography in the area of the memory points.

Thus, the efficiency of the memories including this type of memory device as a memory point is improved, since substantially fewer memory points, or no memory points, are short-circuited. In addition, the technological problems relating to processing by microelectronic methods of memory points having a strong topography are reduced. The reliability of these memories is therefore substantially improved.

In addition, more uniform electrical characteristics between the different points of the memory are obtained.

The term "inert" signifies that the inert electrode is an electrical contact of the memory device from which no metal ion of use for the operation of the device is diffused in the solid electrolyte, unlike the ionisable metal part positioned on the solid electrolyte, the metal ions of which, which were diffused in the solid electrolyte, allow the formation of dendrites in the solid electrolyte, which is positioned between the inert electrode and the ionisable metal part, in the course of operation of the memory device. When the memory device is put in the "on" state (low resistivity state), i.e. when a memory state "1" is written in the device, the inert electrode acts as an inert cathode, and the ionisable metal part, which is an active electrode, forms an anode. When the memory point is deleted, i.e. when it is put in the "off" state (high resistivity state) of the memory device, the inert electrode then forms an inert anode and the active electrode, i.e. the ionisable metal part, forms a cathode of the memory device.

The inert electrode may comprise nickel and/or tungsten, and/or the part of electrically insulating material may comprise boron nitride and/or alumina, and/or the solid electrolyte may comprise chalcogenide, and/or the ionisable metal part may comprise copper and/or silver.

The part of electrically insulating material may be a bilayer, or twin layer, the upper layer of which, in contact with the solid electrolyte, may comprise said electrically insulating material, and/or the thickness of the part of electrically insulating material may be between approximately 10 nm and 500 nm.

The memory device may also include a second electrode, or upper electrode, comprising an electrically conductive material positioned, or stacked, at least on the ionisable metal part.

The memory device may also include at least a second part of at least one electrically insulating material positioned around the solid electrolyte and/or the ionisable metal part and/or, when the device includes an upper electrode, a third part of at least one electrically insulating material positioned around the said upper electrode.

The second part of electrically insulating material and/or the third part of electrically insulating material may comprise $SiO_2$ and/or SiN.

The invention also concerns a method for producing a memory device, including at least the following steps:

a) deposit and etching of an electrically conductive material on a semiconductor substrate, forming at least one inert electrode, b) production of a part of at least one electrically insulating material, or of resistivity higher than that of the material of the inert electrode, around and/or beside the inert electrode, c) deposit of a layer of electrolytic material on at least one part of the inert electrode and of the part of electrically insulating material, d) deposit of a layer of ionisable metal on the layer of electrolytic material, diffusing the metal ions originating from said ionisable metal in the layer of electrolytic material, e) etching of the layers of electrolytic material and of ionisable metal, respectively forming a solid electrolyte and an ionisable metal part, where the ratio between the coefficient of electrical resistivity of the electrically insulating material, or of the material of higher resistivity than that of the material of the inert electrode, and the coefficient of electrical resistivity of the material of the electrode is equal to or higher than approximately 100, and the coefficient of thermal conductivity of the electrically insulating material is equal to or higher than approximately 10 W·m$^{-1}$·K$^{-1}$.

Step b) of production of the part of electrically insulating material may include the use of a deposit of a layer of the said electrically insulating material on the substrate and the inert electrode, followed by a planarisation of the said layer of electrically insulating material with stoppage on the inert electrode.

The method may also include, after step e) of etching of the layers of electrolytic material and of ionisable metal, a step of production of at least a second part of at least one electrically insulating material around the solid electrolyte and/or the ionisable metal part.

The step of production of the second part of electrically insulating material around the solid electrolyte and/or of the ionisable metal part may include the use of a deposit of a layer of the said electrically insulating material around and above the solid electrolyte and/or the ionisable metal part, followed by a planarisation of the said layer of electrically insulating material with stoppage on the ionisable metal part.

The method may also include, after step e) of etching of the layers of electrolytic material and of ionisable metal, a step of production of an upper electrode comprising an electrically conductive material, at least on the ionisable metal part.

The method may also include, after the step of production of the upper electrode, a step of production of at least a third part of electrically insulating material around the second electrode.

The step of production of the third part of electrically insulating material around the upper electrode may include the use of a deposit of a layer of the said electrically insulating material around and above the upper electrode, followed by a planarisation of the said layer of electrically insulating material with stoppage on the upper electrode.

The invention also concerns a memory of the CBRAM type, including at least one memory device as previously disclosed, forming a memory point of the said memory.

This memory may also include at least one addressing transistor linked electrically to the memory device.

BRIEF DESCRIPTION OF THE ILLUSTRATIONS

The present invention will be better understood on reading the description of examples of embodiment given, purely as an indication and in no way limiting, making reference to the appended illustrations in which.

Identical, similar or equivalent parts of the different figures described below bear the same numerical references, to facilitate moving from one figure to another.

The different parts represented in the figures are not necessarily represented according to a uniform scale, in order to make the figures more readable.

The various possibilities (variants and embodiments) must be understood as not being mutually exclusive, and able to be combined with one another.

DETAILED ACCOUNT OF PARTICULAR EMBODIMENTS

Reference is made to FIGS. 3A to 3I, which represent steps of a method of production of a memory device 100 according to a particular embodiment. This device 100 is intended to form a single memory point of a memory 1000. FIGS. 3A to 3I represent only the production of a single memory point, formed by the memory device 100. However, the other memory points of the memory 1000 may be produced simultaneously and/or in a manner comparable to the memory device 100 described in FIGS. 3A to 3I.

Figure 1:
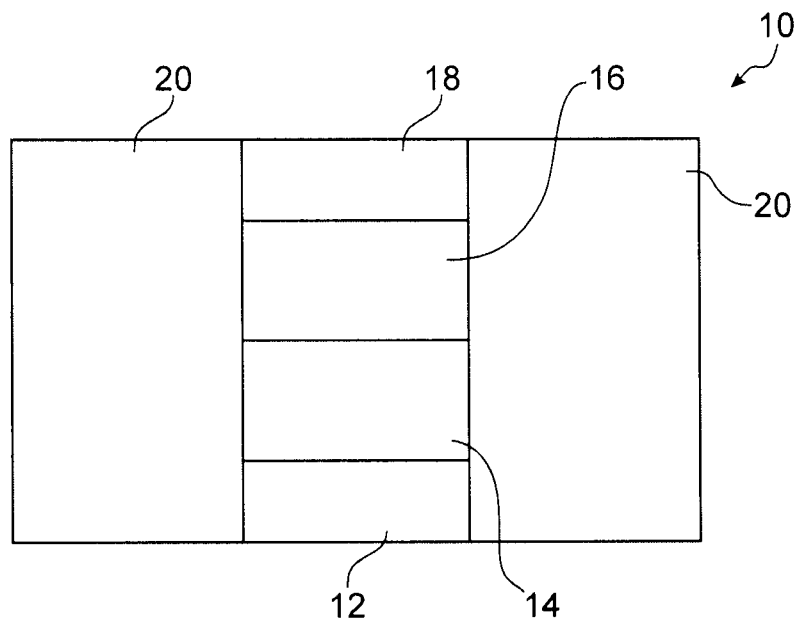
FIG. 1 represents a schematic diagram of a memory cell of the CBRAM type according to the prior art.
Figure 2:
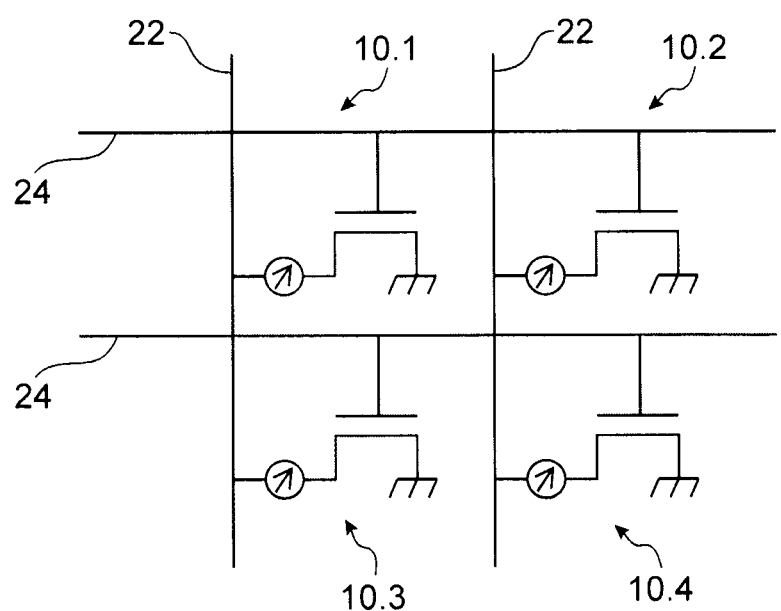
FIG. 2 represents a matrix for addressing memory points of the CBRAM type.
Figure 3A:
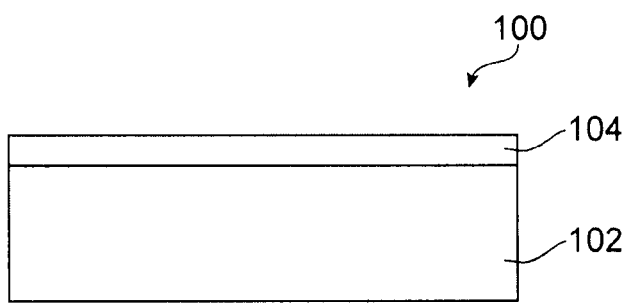
FIGS. 3A to 3I represent steps of a method for producing a memory device, subject of the present invention, intended to form a memory point of a memory, according to a particular embodiment.

As represented in FIG. 3A, the memory device 100 will be produced on a substrate 102, for example composed of a semiconductor such as silicon. In order to accomplish the addressing of the memory device 100, at least one addressing transistor, which is not represented in FIGS. 3A to 3I, is produced in the substrate 102. Generally, each memory point of the memory 1000 may, for example, be controlled by at least one addressing transistor produced in or on the substrate 102. An interconnections layer 104 is also formed on the substrate 102, notably in order to link electrically the addressing transistors to one another, and thus form lines of words and lines of bits of the memory 1000.

Figure 3B:
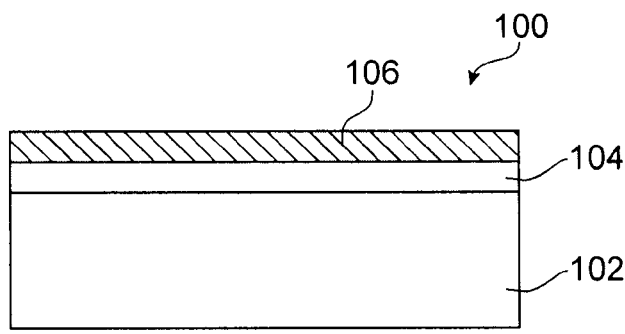

In FIG. 3B, the layer of electrically conductive material 106 is then deposited on the connections layer 104. This electrically conductive material is, for example, aluminium-based and/or copper-based, and/or advantageously nickel-based or tungsten-based. This layer 106 has, for example, a thickness of between approximately 10 nm and 500 nm.

Figure 3C:
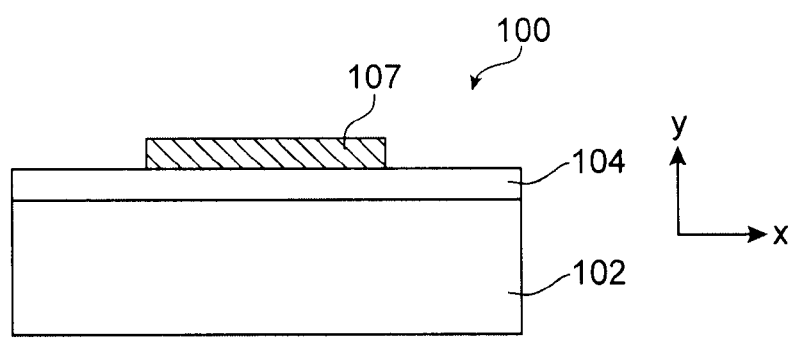
Figure 3D:
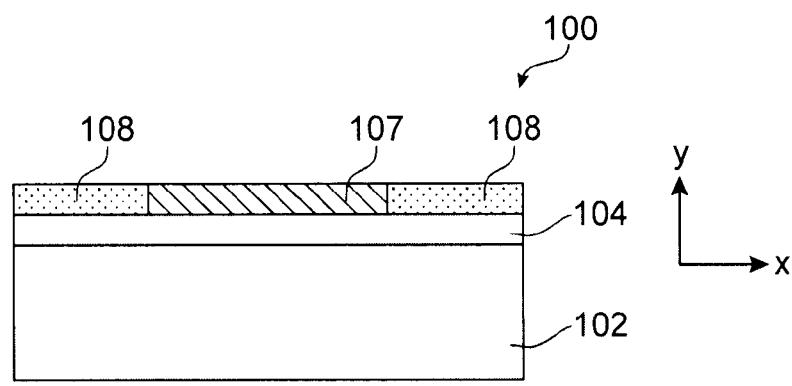

As represented in FIG. 3C, a lower electrode is then formed, forming an inert electrode 107 by producing lithography and an etching of the conductive layer 106. This inert electrode 107 has, for example, a width (dimension in axis x represented in FIG. 3C) equal to approximately 1 μm.

Electrically insulating parts 108 are then produced around the inert electrode 107. To accomplish this, an electrically insulating material is deposited on the inert electrode 107, and around this inert electrode 107 on the connections layer 104. A planarisation, for example of the mechano-chemical type (CMP), of this layer is then accomplished, with stoppage on the inert electrode 107, thus forming the parts 108 represented in FIG. 3D. The total width of the parts 108 and of the inert electrode 107 is, for example, equal to approximately 8 μm. In addition, the thickness of the parts 108 is roughly equal to that of the inert electrode 107, as a consequence of the planarisation accomplished.

The electrically insulating material used to produce the parts 108 is chosen such that it forms a less good electrical conductor than the material of the inert electrode 107, such that the most or all of the current intended to traverse the device 100 passes through the inert electrode 107. The materials of the inert electrode 107 and of the parts 108 are also chosen such that the ratio between the coefficient of electrical resistivity of the material of the parts 108 and the coefficient of electrical resistivity of the material of the inert electrode 107 is preferably equal to or greater than approximately 100. The material of the parts 108 may be chosen advantageously in order that its coefficient of resistivity is greater than or equal to approximately $10^5$ ohm·cm, or advantageously greater than or equal to approximately $10^{10}$ ohm·cm, or in particular between approximately $10^{10}$ ohm·cm and $10^{20}$ ohm·cm, for example equal to $10^{14}$ ohm·cm. In addition, the material of the parts 108 is chosen such that the coefficient of thermal conductivity of this material is equal to or greater than 10 W·m$^{-1}$·K$^{-1}$. These parts 108 are, for example, made from boron nitride (thermal conductivity equal to approximately 60 W·m$^{-1}$·K$^{-1}$) and/or from alumina (Al$_2$O$_3$, thermal conductivity equal to approximately 30 W·m$^{-1}$·K$^{-1}$). In a variant it is also possible that the parts 108 are formed from a bilayer of materials, where the material of the upper layer (the lower layer being the one in contact with the layer of connections 104) is a material meeting the conditions of thermal conductivity and electrical insulation described above. The lower layer may comprise SiO$_2$ and/or SiN, and/or any other electrically insulating material.

Figure 3E:
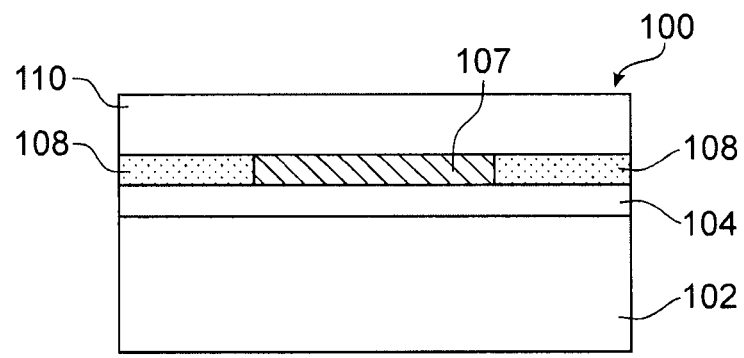
Figure 3F:
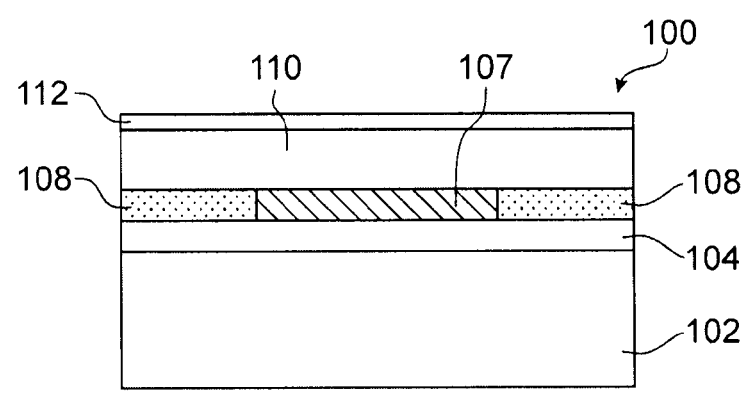

As represented in FIG. 3E, a layer 110 is then deposited, intended to produce a solid electrolyte. This layer 110 comprises, for example, chalcogenide. Chalcogenide is taken to mean an alloy composed of at least one chalcogen element (element from column VI of the periodic table of the elements), i.e. oxygen, sulphur, selenium, tellurium or polonium, and a more electropositive element, for example an element from column IV or V of the periodic table of the elements such as arsenic, antimony or bismuth in the case of elements from column IV, or germanium, tin or lead in the case of the elements from column V. The chalcogenide used may therefore mainly be composed of GeSe, and/or GeS, and/or GeTe, and/or AsS and/or AsSe. A layer of ionisable metal 112 is then deposited on layer 110 (FIG. 3F). This ionisable metal is, for example, silver and/or copper and/or zinc. The thickness of the solid electrolyte may advantageously be between approximately 10 nm and 500 nm, and in particular between approximately 20 nm and 180 nm, and, for example, be equal to approximately 50 nm. The thickness of the layer of ionisable metal may advantageously be between approximately 2 nm and 100 nm, and advantageously be between 5 nm and 40 nm, for example equal to approximately 15 nm.

During the deposit of the layer of ionisable metal 112 on the layer of chalcogenide 110, metal ions originating from the layer of ionisable metal 112 are diffused in the layer of chalcogenide 110. As a consequence of the fact that the parts 108 comprise a material the coefficient of thermal conductivity of which is equal to or greater than approximately 10 W·m$^{-1}$·K$^{-1}$, a more uniform thermal gradient is obtained across the whole of the surface formed by the parts 108 and the inert electrode 107, on which is deposited the layer of chalcogenide 110. Thus, the metal ions are distributed uniformly across the whole of the layer of chalcogenide 110. The ion concentration in the layer of chalcogenide 110 is notably roughly similar to the level of the inert electrode 107 and to the level of the electrically insulating parts 108.

In addition, by making parts 108 of electrically insulating material of thickness equal to or greater than approximately 10 nm, all risks of leakage of current are prevented during operation of the memory device 100, between the inert electrode 107 and the parts 108, firstly, and secondly a satisfactory emission of heat occurs when the layer of ionisable metal 112 is deposited. In addition, the thickness of the insulating parts 108 is chosen in this case such that it is less than approximately 500 nm in order to prevent the problems of mechanical stresses caused on the device 100 and the topology problems.

Figure 3G:
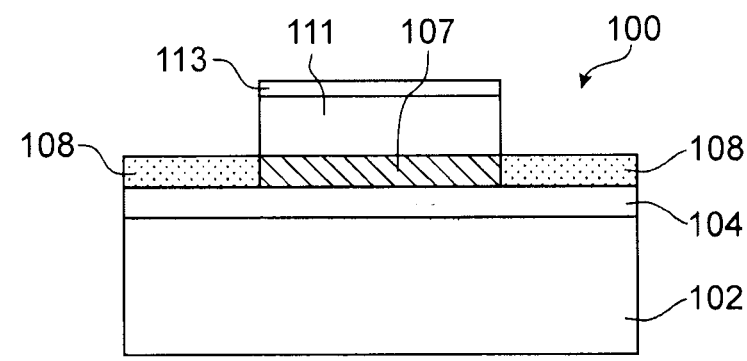

A lithography and an etching of the previously deposited layers 110 and 112 is then accomplished, thus forming a solid electrolyte 111 and an ionisable metal part 113 forming, for example, the anode of the memory device 100 when the inert electrode 107 forms the cathode of the memory device 100 (FIG. 3G).

The deposited chalcogenide may be intrinsically doped. It is also possible to implement a step of doping, for example by thermal treatment or UV radiation, of this layer of chalcogenide 110 or of the solid electrolyte 111. In the case of a doping by thermal treatment, the device 100 is treated thermally after layers 110 and 112 are deposited. The temperature of this thermal treatment is judiciously chosen in order to enable the diffusion of the ionisable metal in the chalcogenide. The thermal treatment temperature may advantageously be chosen at between approximately 200° C. and 400° C. In the case of a step of doping by UV radiation (or photodissolution), device 100 is subjected to UV radiation after layers 110 and 112 are deposited. In this case the thickness of the layer of ionisable metal 112 is low, to enable the UV rays to reach the layer of chalcogenide 110. If the desired quantity of ionisable metal is substantial, it is possible to undertake the photodissolution of the metal in several steps: deposit of a thin layer of ionisable metal followed by photodissolution, deposit of a second layer of ionisable metal followed by photodissolution, repeated as many times as required. A thin layer of ionisable metal is understood to mean a layer of thickness advantageously between approximately 1 nm and 40 nm.

In addition, it is also possible to increase the concentration of metal ions originating from the layer of ionisable metal 112 in the layer of chalcogenide 110 by undertaking a thermal treatment or UV radiation on the layer of ionisable metal 112. The concentration of ionisable metal in the chalcogenide may be between approximately 15% and 50%. A range of concentrations of ionisable metal in the chalcogenide is advantageously positioned between approximately 25% and 35%, for example equal to approximately 30%.

Figure 3H:
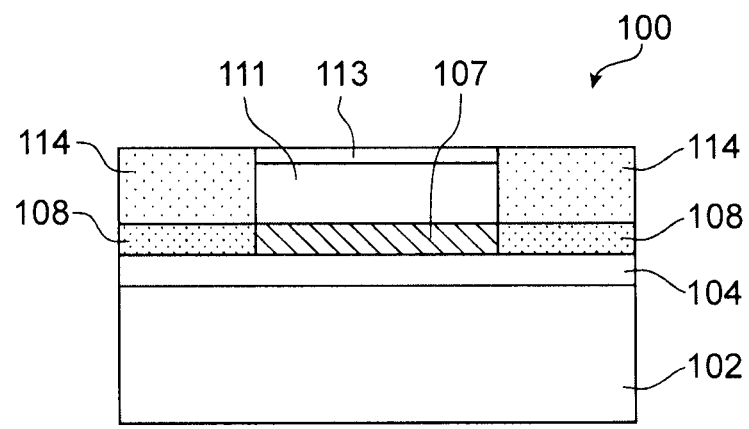

As represented in FIG. 3H, a layer of electrically insulating material is then deposited, for example comprising SiO$_2$ and/or SiN, on the parts 108 and also on the ionisable metal part 113. A planarisation of this layer of material is then undertaken, with stoppage on the ionisable metal part 113, forming second parts 114 of electrically insulating material.

Figure 3I:
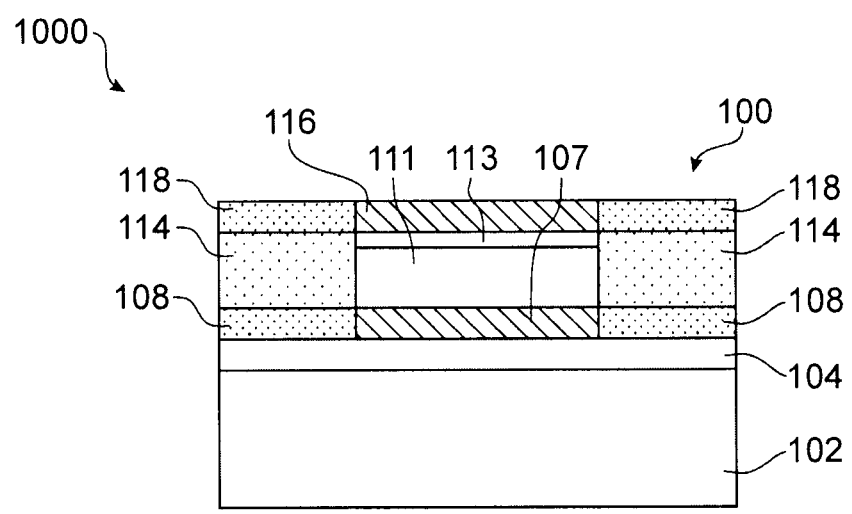

Finally, in a manner comparable to the production of the inert electrode 107, an upper electrode 116 is produced, which in this case acts as an electrical contact, by depositing an electrically conductive material, for example nickel and/or tungsten, on the ionisable metal part 113, which forms the active electrode of the device, and on the second parts 114 of electrically insulating material. This electrically conductive material is then etched to form the upper electrode 116. A layer of electrically insulating material such as SiN and/or SiO$_2$ is then deposited on this upper electrode 116 and on the second parts 114 of electrically insulating material, and then planarised with stoppage on the upper electrode 116, thus forming third parts 118 of electrically insulating material (FIG. 3I).

Generally, the various elements of the memory device 100 will be able to be produced in thin layers, i.e. produced from layers the thickness of which is less than or equal to approximately 500 nm. The layers from which the elements of the memory device 100 are produced may be deposited by PVD (physical vapor deposit), CVD (chemical vapour deposit), MOCVD (metal-organic chemical vapour deposit), or alternatively by electrolysis.

The invention claimed is:
1. A memory device comprising:
an inert electrode including an electrically conductive material;
a part of at least one electrically insulating material of resistivity higher than that of the material of the inert electrode, positioned around the inert electrode within a layer defined by a thickness of the inert electrode, the thickness of the inert electrode being substantially equal to a thickness of the electrically insulating material, and a coefficient of thermal conductivity of the electrically insulating material being equal to or higher than approximately 10 W·m$^{-1}$·K$^{-1}$;

a solid electrolyte positioned on at least one part of the inert electrode and of the part of electrically insulating material, and including metal ions originating from a separate ionisable metal layer positioned on top of a top surface of the solid electrolyte, wherein the solid electrolyte comprises chalcogenide and a concentration of the ionisable metal layer in the chalcogenide is between approximately 15% and 50%; and an upper electrode including an electrically conductive material positioned at least on top of a top surface of the ionisable metal layer;

wherein a ratio between a coefficient of electrical resistivity of the electrically insulating material of resistivity higher than that of the electrically conductive material of the inert electrode and a coefficient of electrical resistivity of the electrically conductive material of the inert electrode is equal to or higher than approximately 100.

2. The memory device according to claim 1, wherein the inert electrode comprises at least one of nickel or tungsten.

3. The memory device according to claim 1, wherein the part of electrically insulating material is a bilayer, an upper layer of which, in contact with the solid electrolyte, comprising the electrically insulating material.

4. The memory device according to claim 1, further comprising at least a second part of at least one electrically insulating material positioned around the solid electrolyte or the ionisable metal layer, and the device including an upper electrode, and a third part of at least one electrically insulating material positioned around the upper electrode.

5. The memory device according to claim 4, wherein the second part of the electrically insulating material or the third part of electrically insulating material comprise at least one of SiO$_2$ or SiN.

6. A method for producing a memory device, comprising:
  a) depositing and etching an electrically conductive material on a semiconductor substrate, forming at least one inert electrode;
  b) producing a part of at least one electrically insulating material of resistivity higher than that of the material of the inert electrode, around the inert electrode within a layer defined by a thickness of the inert electrode, the thickness of the inert electrode being substantially equal to a thickness of the electrically insulating material, and a coefficient of thermal conductivity of the electrically insulating material being equal to or higher than approximately 10 W·m$^{-1}$·K$^{-1}$;
  c) depositing a layer of electrolytic material on at least one part of the inert electrode and of the part of electrically insulating material;
  d) depositing a separate layer of ionisable metal on top of a top surface of the layer of electrolytic material, diffusing metal ions originating from the ionisable metal layer into the layer of electrolytic material;
  e) etching the layers of electrolytic material and of ionisable metal, respectively forming a solid electrolyte and an ionisable metal part, wherein the solid electrolyte comprises chalcogenide and a concentration of the ionisable metal in the chalcogenide is between approximately 15% and 50%; and
  f) producing an upper electrode including an electrically conductive material, at least on top of a top surface of the ionisable metal part,
  wherein a ratio between a coefficient of electrical resistivity of the electrically insulating material of resistivity higher than that of the material of the inert electrode and a coefficient of electrical resistivity of the electrically conductive material of the inert electrode is equal to or higher than approximately 100.

7. The method of production according to claim 6, wherein the b) producing the part of electrically insulating material includes use of a deposit of a layer of the electrically insulating material on the substrate and the inert electrode, followed by a planarization of the layer of electrically insulating material with stoppage on the inert electrode.

8. The method of production according to claim 6, further comprising, after the e) etching the layers of electrolytic material and of ionisable metal, f) producing at least a second part of at least one electrically insulating material around at least one of the solid electrolyte or of the ionisable metal part.

9. The method of production according to claim 8, wherein the f) producing the second part of electrically insulating material around at least one of the solid electrolyte or of the ionisable metal part includes use of a deposit of a layer of the electrically insulating material around and above the solid electrolyte or the ionisable metal part, followed by a planarization of the layer of electrically insulating material with stoppage on the ionisable metal part.

10. The method of production according to claim 6, further comprising, after the f) producing the upper electrode, g) producing at least a third part of electrically insulating material around the upper electrode.

11. The method of production according to claim 10, in which the g) producing the third part of electrically insulating material around the upper electrode includes use of a deposit of a layer of the electrically insulating material around and above the upper electrode, followed by a planarization of the layer of electrically insulating material around and above the upper electrode with stoppage on the upper electrode.

12. A memory of the CBRAM type, including at least one memory device according to claim 1, which forms a memory point of the said memory.

13. The memory according to claim 12, further comprising at least one addressing transistor electrically linked to the memory device.

14. The memory device according to claim 1, wherein the coefficient of thermal conductivity of the part of electrically insulating material is equal to or less than approximately 60 W·m$^{-1}$·K$^{-1}$, the inert electrode comprises at least one of nickel or tungsten, and the coefficient of electrical resistivity of the part of the electrical insulating material is between approximately $10^5$ ohm·cm and $10^{20}$ ohm·cm.

15. The memory device according to claim 1, wherein the part of the electrically insulating material comprises at least one of boron or alumina.

16. The memory device according to claim 1, wherein the ionisable metal layer comprises at least one of copper or silver.

17. The memory device according to claim 1, wherein a thickness of the electrically insulating material is between approximately 10 nm and 500 nm.

* * * * *